(12) United States Patent
Dai et al.

(10) Patent No.: US 10,186,675 B2
(45) Date of Patent: Jan. 22, 2019

(54) TOP-EMITTING WHITE ORGANIC LIGHT EMITTING DIODE DEVICE, METHOD FOR MANUFACTURING THE SAME, AND DISPLAY APPARATUS

(71) Applicant: BOE TECHNOLOGY GROUP CO., LTD., Beijing (CN)

(72) Inventors: Qing Dai, Beijing (CN); Ze Liu, Beijing (CN); Li Sun, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 36 days.

(21) Appl. No.: 14/888,736

(22) PCT Filed: Mar. 5, 2015

(86) PCT No.: PCT/CN2015/073671
§ 371 (c)(1),
(2) Date: Nov. 3, 2015

(87) PCT Pub. No.: WO2016/074378
PCT Pub. Date: May 19, 2016

(65) Prior Publication Data
US 2016/0343967 A1 Nov. 24, 2016

(30) Foreign Application Priority Data
Nov. 13, 2014 (CN) .......................... 2014 1 0640299

(51) Int. Cl.
*H01L 51/50* (2006.01)
*H01L 51/52* (2006.01)
*H01L 51/56* (2006.01)

(52) U.S. Cl.
CPC ............ *H01L 51/504* (2013.01); *H01L 51/52* (2013.01); *H01L 51/5203* (2013.01); *H01L 51/5237* (2013.01); *H01L 51/56* (2013.01)

(58) Field of Classification Search
CPC ............... H01L 51/5265; H01L 51/504; H01L 51/5203
See application file for complete search history.

(56) References Cited

U.S. PATENT DOCUMENTS

2005/0280364 A1* 12/2005 Omura ................ H01L 51/5265
313/506
2007/0096636 A1* 5/2007 Park .................... H01L 27/3246
313/503
(Continued)

FOREIGN PATENT DOCUMENTS

CN 101013745 A 8/2007
CN 102362368 A 2/2012
(Continued)

OTHER PUBLICATIONS

Yue-Feng Liu, Jing Feng, Yan-Gang Bi, Jun-Feng Song, Yu Jin, Yu Bai, Qi-Dai Chen, and Hong-Bo Sun, "Omnidirectional emission from top-emitting organic light-emitting devices with microstructured cavity," Opt. Lett. 37, 124-126 (2012).*
(Continued)

*Primary Examiner* — Lex Malsawma
*Assistant Examiner* — Laura Dykes
(74) *Attorney, Agent, or Firm* — Harness, Dickey & Pierce, P.L.C.

(57) ABSTRACT

The present disclosure provides a top-emitting white organic light emitting diode (OLED) device, a method for manufacturing the same and a display apparatus. The OLED device includes a plurality of pixel units on a substrate, wherein each pixel unit includes a first electrode layer, an organic layer and a second electrode layer arranged subsequently on the substrate from bottom up, and the organic layer in each pixel unit includes a gradually-varied cavity (Continued)

length, and the gradually-varied cavity length corresponds to a range from a wavelength of red light to a wavelength of blue light.

13 Claims, 5 Drawing Sheets

(56) References Cited

U.S. PATENT DOCUMENTS

| | | |
|---|---|---|
| 2007/0159086 A1 | 7/2007 | Yu et al. |
| 2008/0122347 A1* | 5/2008 | Lee ............... H01L 27/3244 313/504 |
| 2009/0051275 A1 | 2/2009 | Kobayashi et al. |
| 2009/0085477 A1* | 4/2009 | Hwang ............ H01L 51/5265 313/504 |
| 2009/0115326 A1* | 5/2009 | Chan ............... H01L 51/5265 313/504 |
| 2010/0289727 A1* | 11/2010 | Miller ............... G09G 3/2003 345/76 |
| 2011/0303905 A1* | 12/2011 | Gather ............. H01L 51/5265 257/40 |
| 2012/0187435 A1* | 7/2012 | Gy .................... C03C 17/3411 257/98 |
| 2014/0151651 A1 | 6/2014 | Jin et al. |
| 2015/0060840 A1* | 3/2015 | Nishimura ......... H01L 51/5275 257/40 |
| 2015/0187858 A1* | 7/2015 | Wang ................ H01L 27/3216 257/40 |

FOREIGN PATENT DOCUMENTS

| | | |
|---|---|---|
| CN | 103811669 A | 5/2014 |
| CN | 104319352 A | 1/2015 |
| CN | 204179111 U | 2/2015 |
| TW | 200922371 A | 5/2009 |
| WO | WO-2013187149 A1 | 12/2013 |

OTHER PUBLICATIONS

Yue-Feng Liu et al., Viewing-angle independence of white emission from microcavity top-emitting organic light-emitting devices with periodically and gradually changed cavity length, In Organic Electronics, vol. 14, Issue 6, 2013, pp. 1597-1601.*

S. Hofmann, M. Thomschke, B. Lüssem, and K. Leo, "Top-emitting organic light-emitting diodes," Opt. Express 19, A1250-A1264 (2011).*

First Office Action regarding Chinese application No. 201410640299.7, dated Mar. 22, 2016. Translation provided by Dragon Intellectual Property Law Firm.

Written Opinion of the International Searching Authority for international application No. PCT/CN2015/073671.

Second Office Action regarding Chinese application No. 201410640299.7, dated Oct. 31, 2016. Translation provided by Dragon Intellectual Property Law Firm.

Third Office Action regarding Chinese Application No. 201410640299.7, dated Apr. 24, 2017. Translation provided by Dragon Intellectual Property Law Firm.

* cited by examiner

TOP-EMITTING WHITE ORGANIC LIGHT EMITTING DIODE DEVICE, METHOD FOR MANUFACTURING THE SAME, AND DISPLAY APPARATUS

CROSS-REFERENCE TO RELATED APPLICATION

This application is the U.S. national phase of PCT Application No. PCT/CN2015/073671 filed on Mar. 5, 2015, which claims a priority of the Chinese Patent Application No. 201410640299.7 filed on Nov. 13, 2014, the disclosures of which are incorporated in their entirety by reference.

TECHNICAL FIELD

The present disclosure relates to the field of organic light-emitting diode (OLED) display technology, and in particular to a top-emitting white OLED device, a method for manufacturing the same and a display apparatus.

BACKGROUND

An organic light-emitting diode (OLED) is called as a third-generation dreamlike display technology as it has the following advantages: active light-emitting, good temperature characteristic, low power consumption, fast response, being flexible, ultra light and thin, and low cost. At present, with the continuous funding, research and development of manufacturers all over the world, an OLED panel display technology is becoming a more and more mature mass production technology, and a market requirement thereof is growing rapidly.

There are mainly two kinds of OLEDs in terms of light-emitting direction, i.e., a bottom-emitting OLED and a top-emitting OLED. The bottom-emitting OLED refers to an OLED where light is emitted from a substrate, and the top-emitting OLED refers to an OLED where light is emitted from a top of a device. The top-emitting OLED may not be influenced whether light can pass through the substrate or not, therefore an aperture ratio of a display panel may be improved effectively, thereby expanding a thin film transistor (TFT) circuit design of the substrate and expanding a scope of electrode materials to be selected, which is beneficial to an integration of the device and the TFT circuit.

Although the OLED may improve device efficiency, narrow a spectrum and improve color purity, the OLED generally is of a strong microcavity effect. Due to the microcavity effect, an electroluminescence spectrum of the OLED may vary with a viewing angle, and an efficiency of the OLED may decrease significantly when the viewing angle is large, i.e., the efficiency of the OLED may depend on the viewing angle due to the microcavity effect, which is an obvious disadvantage for a high-precision panel display.

SUMMARY

In view of this, the present disclosure provides a top-emitting white OLED device, a method for manufacturing the same, and a display apparatus, so as to solve the issue in the related art that the larger the viewing angle is, the worse an effect of light-emitting of the top-emitting white OLED may be due to the microcavity effect.

To solve the above technical issues, a top-emitting white organic light emitting diode (OLED) device is provided by the present disclosure, including a plurality of pixel units on a substrate. Each pixel unit includes a first electrode layer, an organic layer and a second electrode layer arranged subsequently on the substrate from bottom up. The organic layer in each pixel unit comprises a gradually-varied cavity length, and the gradually-varied cavity length corresponds to a range from a wavelength of red light to a wavelength of blue light.

Alternatively, a surface of the first electrode layer facing the organic layer has a periodically fluctuated structure.

Alternatively, the periodically fluctuated structure is a lattice structure, which includes a plurality of continuous bumps or a plurality of bumps and pits arranged at intervals.

Alternatively, a height difference between a crest and a trough of the bump is within a range of a difference of optic cavity lengths corresponding to a variation of a wavelength of visible light, and an interval between crests or troughs of the bumps is smaller than or equal to a width of the pixel unit.

Alternatively, the height difference between the crest and the trough of the bump is in a range from 20 to 150 nanometers, and the interval between the crests or troughs of the bumps is in a range from 1 to 10 micrometers.

Alternatively, the bumps are hemispherical or near-hemispherical, and the pits are hemispherical or near-hemispherical.

Alternatively, a profile of the lattice structure is a near-sine wave when the lattice structure includes a plurality of bumps and pits arranged at intervals.

Alternatively, the top-emitting white OLED device further includes a resin layer under the first electrode layer, where a surface of the resin layer facing the first electrode layer has a same periodically fluctuated structure as the first electrode layer. Alternatively, the resin layer includes polyimide.

Alternatively, the periodically fluctuated structure of the first electrode layer is substantially filled up with the organic layer.

Alternatively, the first electrode layer is a reflective electrode, and the second electrode layer is a transflective electrode.

A method for manufacturing a top-emitting white OLED device is further provided, including a step of forming a plurality of pixel units on a substrate. Each pixel unit includes a first electrode layer, an organic layer and a second electrode layer arranged subsequently on the substrate from bottom up, where the organic layer in each pixel unit includes a gradually-varied cavity length, and the gradually-varied cavity length corresponds to a range from a wavelength of red light to a wavelength of blue light.

Alternatively, the method further includes:

forming a resin layer on the substrate, where a surface of the resin layer is of a lattice structure which the lattice includes a plurality of continuous bumps or a plurality of bumps and pits arranged at intervals;

forming a first electrode layer on the resin layer, where a surface of the first electrode layer has the same lattice structure as the resin layer;

forming an organic layer on the first electrode layer, with which the fluctuated structure of the first electrode layer is substantially filled up; and forming a second electrode layer on the organic layer.

Alternatively, in the lattice structure of the resin layer, the bumps are hemispherical or near-hemispherical, where a height difference between a crest and a trough of the bump is in a range from 20 to 150 nanometers, and an interval between the crests or troughs of the bumps is in a range from 1 to 10 micrometers.

Alternatively, the step of forming the resin layer on the substrate includes:

coating a precursor ink configured to form a resin onto the substrate by means of printing, to form a uniform liquid drop lattice structure, and removing a solvent from the liquid drop lattice and subjecting the liquid drop lattice structure to a cross-linked polymerization, so as to form the resin layer with the lattice structure after the liquid drop lattice is cured.

Alternatively, the step of forming the resin layer on the substrate includes:

forming a resin film on the substrate by means of coating; and exposing and developing the resin film by using a photomask, to form the resin layer with a lattice structure.

A display apparatus is further provided by the present disclosure, including the top-emitting white OLED device hereinabove.

The technical scheme of the present disclosure has the following advantages: in the top-emitting white OLED device, a cavity length of an organic layer of a pixel unit is gradually-varied, and the gradually-varied cavity length corresponds to a range from a wavelength of red light to a wavelength of blue light, so that the cavity length enhancing the microcavity is varied at different positions of the organic layer, thus an intensity of white light of the pixel unit may be enhanced.

DETAILED DESCRIPTION

To make the technical problem, technical solution and advantages of the present disclosure more clear, the present disclosure will be described in details in conjunction with embodiments and drawings.

Figure 1:
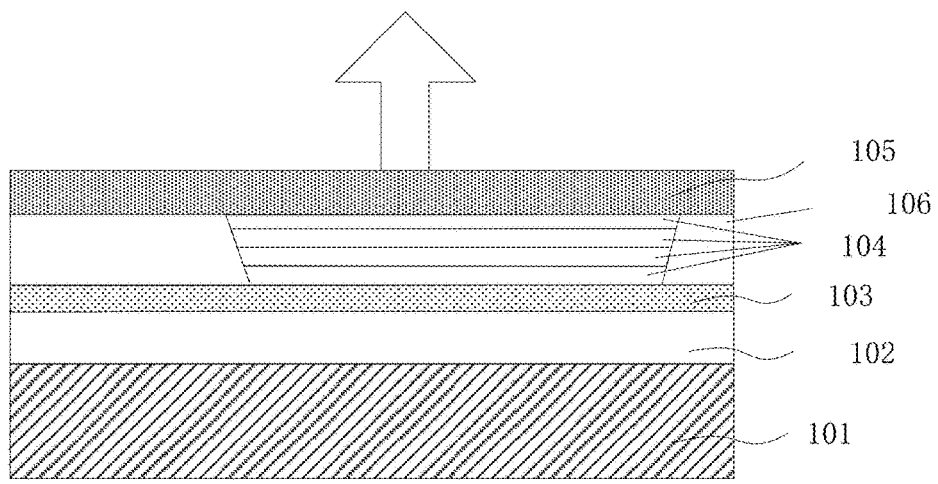
FIG. 1 is a schematic view showing a structure of a top-emitting white OLED device in the related art.

FIG. 1 is a schematic view showing a structure of a top-emitting white OLED device in the related art. The OLED device includes a glass substrate 101, a thin film transistor (TFT) functional layer, a planarizing layer 102, a first electrode layer 103, an organic layer 104, a second electrode layer 105 and a pixel defining layer 106. In FIG. 1, an arrow shows a direction of light-emitting.

As shown in FIG. 1, the organic layer 104 in a pixel unit has the same cavity length at different locations thereof. Due to a microcavity effect, an intensity of only a kind of visible light which has an optimum wavelength may be enhanced, while visible light of other wavelengths may be filtered out, such that a light intensity may be decreased when a viewing angle is large.

In view of this, a top-emitting white OLED device is provided by the present disclosure, including a plurality of pixel units on a substrate, where each pixel unit includes a first electrode layer, an organic layer and a second electrode layer subsequently arranged on the substrate from bottom up. The organic layer in each pixel unit includes a gradually-varied cavity length (i.e., thickness), and the gradually-varied cavity length corresponds to a range from a wavelength of red light to a wavelength of blue light, such that an intensity of white light of the pixel unit may be enhanced.

In an embodiment of the present disclosure, the organic layer in the pixel unit has the gradually-varied cavity length, and the gradually-varied cavity length corresponds to the range from the wavelength of red light to the wavelength of blue light. Therefore, different positions of the organic layer correspond to different microcavity-enhanced cavity lengths, and then an emission intensity of white light of the pixel unit may be enhanced.

In the embodiment of the present disclosure, the first electrode layer is a bottom electrode (generally as an anode), and the second electrode layer is a top electrode (generally as a cathode). The first electrode layer is a reflective electrode, and materials thereof may include one of gold, silver and aluminum or an alloy of them. The second electrode layer is a transflective electrode, and materials thereof may include gold, silver or an alloy of them.

The top-emitting white OLED device in the embodiment of the present disclosure may be of various structures. The structure of the top-emitting white OLED device may be illustrated in the following.

First Embodiment

Figure 2:
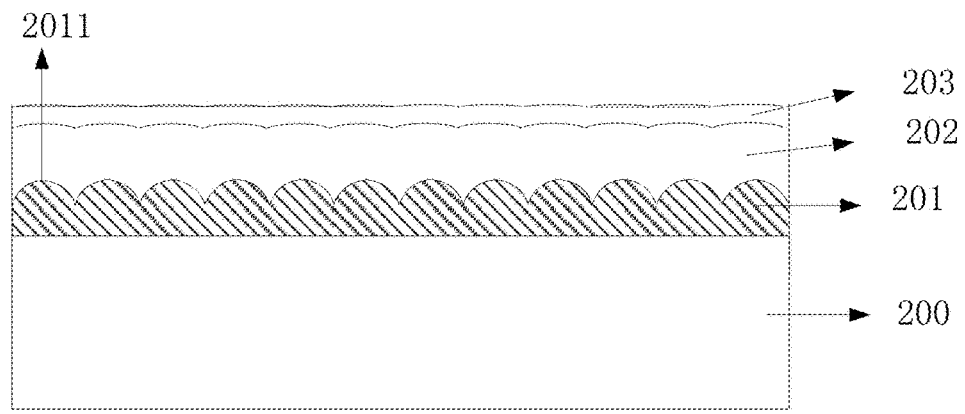
FIG. 2 is a schematic view showing a structure of a top-emitting white OLED device according to an embodiment of the present disclosure.

FIG. 2 is a schematic view showing a structure of a top-emitting white OLED device according to the first embodiment of the disclosure. The top-emitting white OLED device includes: a substrate 200, a first electrode layer 201 formed on the substrate 200, an organic layer 202 on the first electrode layer 201, and a second electrode layer 203 on the organic layer 202. A surface of the first electrode layer 201 facing the organic layer 202 has a periodically fluctuated structure. The periodically fluctuated structure may be a lattice structure which includes a plurality of continuous bumps 2011.

The substrate 200 may include a base substrate, a TFT functional layer and a planarizing layer.

FIG. 2 shows only a part of one pixel unit.

Figure 3:
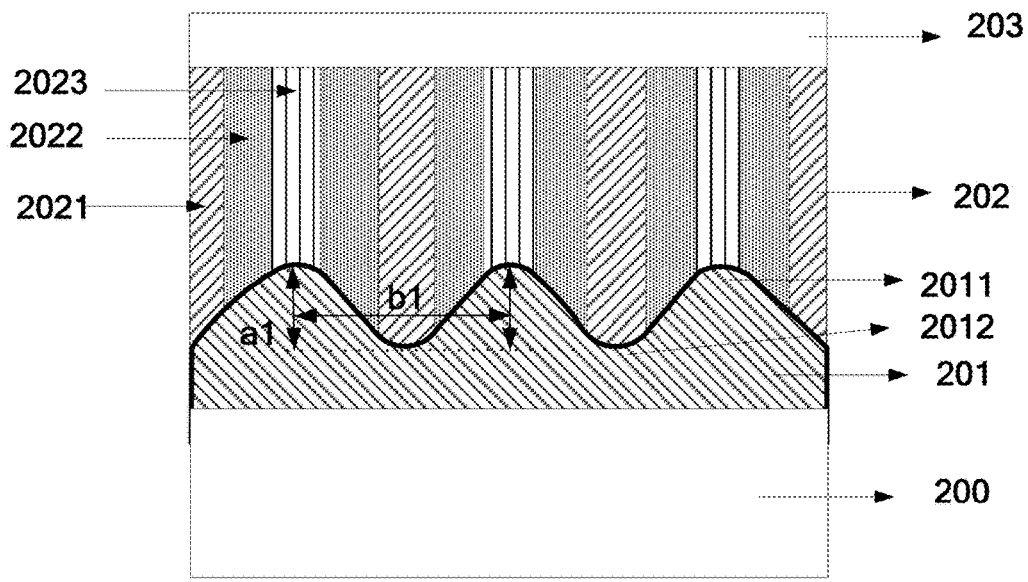
FIG. 3 is a schematic view showing a principle of light-emitting enhancement of the top-emitting white OLED device in FIG. 2.

FIG. 3 is a schematic view showing a principle of light-emitting enhancement of the top-emitting white OLED device in FIG. 2. As shown in FIG. 3, a thickness of the organic layer 202 is varied at different positions of the pixel unit. A wavelength of red visible light is in a range from 630 to 780 nanometers, and a wavelength of blue visible light is in a range from 420 to 470 nanometers, so an organic layer part 2021 corresponding to the red visible light has a longest cavity length, and an organic layer part 2023 corresponding to the blue visible light has a shortest cavity length. As shown in FIG. 3, an organic layer part 2022 corresponds to visible light of other colors.

Alternatively, a height difference a1 between a crest and a trough of the bump 2011 is within a range of a difference of optic cavity lengths corresponding to a variation of a wavelength of visible light, and an interval b1 (i.e., a period of the crests) between crests (or troughs) of the bumps 2011 is smaller than or equal to a width of the pixel unit.

In order to enhance the white light intensity effectively, alternatively, the height difference between a crest and a trough of the bump 2011 is in a range from 20 to 150 nanometers, and the interval between the crests (or troughs) of the bumps 2011 is in a range from 1 to 10 micrometers.

In the embodiment of the present disclosure, the organic layer 202 may include multiple layers. For example, the organic layer 202 may include a hole-injection layer (HIL), a hole-transporting layer, a light-emitting layer, a charge-generating layer, a connecting layer, an electron-transporting layer, an electron-injection layer, a hole-blocking layer, an electron-blocking layer, etc. At least one layer (e.g., the HIL) of the organic layer 202 has a large thickness adjustment tolerance, so as to substantially fill up the fluctuated surface of the first electrode layer, so that the organic layer in the pixel unit may have a gradually-varied cavity length.

Alternatively, the bumps 2011 in the embodiment of the present disclosure are hemispherical or near-hemispherical. Alternatively, the bumps 2011 may further be of other shapes.

As shown in FIG. 1, the organic layer 104 in the pixel unit has the same thickness (cavity length) at different positions thereof, so a cavity length of an actual light path when viewing at a large angle is longer than that when viewing the OLED device along a direction perpendicular thereto, then a color cast may occur as a result.

In the embodiment of the present disclosure, since the lattice structure of the first electrode layer 201 has a fluctuated surface, the cavity lengths at different positions where the light is reflected just coincide with a gradually-varied spectrum of the white light OLED device. Even though the viewing angle is large, it may be guaranteed that the cavity lengths at different positions of the pixel are nearly the same. Therefore, the color cast effect may be weaken significantly, and the light intensity may not be decreased significantly.

Second Embodiment

Figure 4:
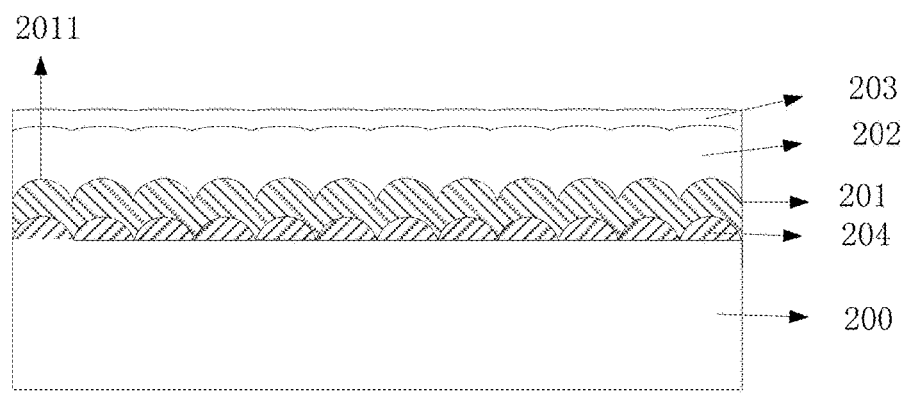
FIG. 4 is a schematic view showing a structure of a top-emitting white OLED device according to another embodiment of the present disclosure.

FIG. 4 is a schematic view showing a structure of a top-emitting white OLED device according to the second embodiment of the disclosure. The OLED device includes: a substrate 200, a resin layer 204 formed on the substrate 200, a first electrode layer 201 arranged on the resin layer, an organic layer 202 on the first electrode layer 201, and a second electrode layer 203 on the organic layer 202. The resin layer 204 is under the first electrode layer 201, and a surface of the resin layer 204 facing the first electrode layer 201 has a same periodically fluctuated structure as the first electrode layer 201.

The substrate 200 may include a base substrate, a TFT functional layer and a planarizing layer.

The first electrode layer 201 with a reflection function is generally made of metal materials, and a process of forming directly on the substrate 200 the first electrode layer 201 with a lattice structure is difficult. Therefore, in the embodiment of the present disclosure, the resin layer 204 with the lattice structure may be formed on the substrate 200 firstly, to make a model for the first electrode layer 201. Then the first electrode layer 201 with the same lattice structure as the resin layer 204 is formed on the resin layer 204, such that the process difficulty may be reduced.

The resin layer 204 may be made of materials such as polyimide (PI). Alternatively, the resin layer 204 for making the model may further be made of other materials easy to make the model.

Figure 5:
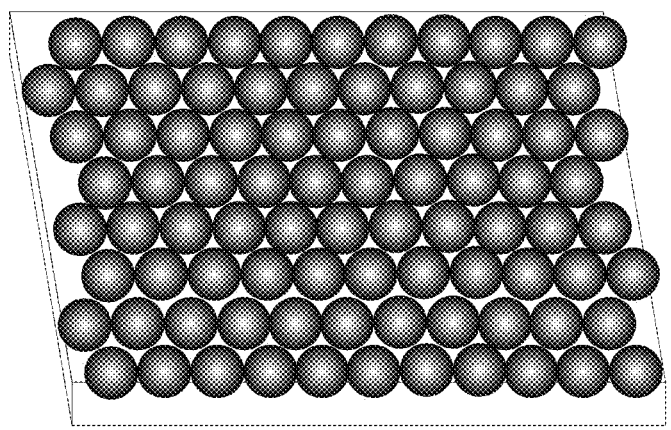
FIG. 5 is a top view of a top of a resin layer according to an embodiment of the present disclosure.
Figure 6:
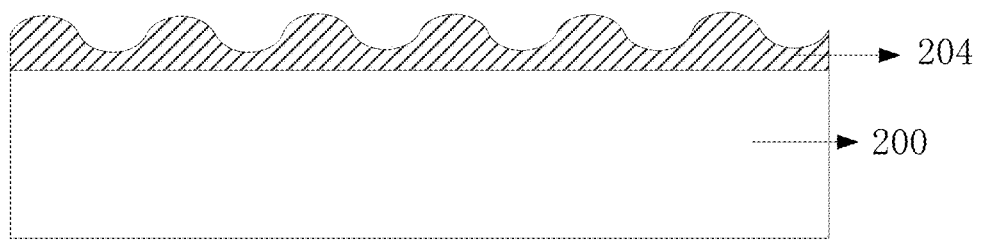
FIG. 6 is a section view of the resin layer according to the embodiment of the present disclosure.

FIG. 5 is a top view of a top of a resin layer according to an embodiment of the present disclosure. FIG. 6 is a section view of the resin layer according to the embodiment of the present disclosure.

Figure 7:
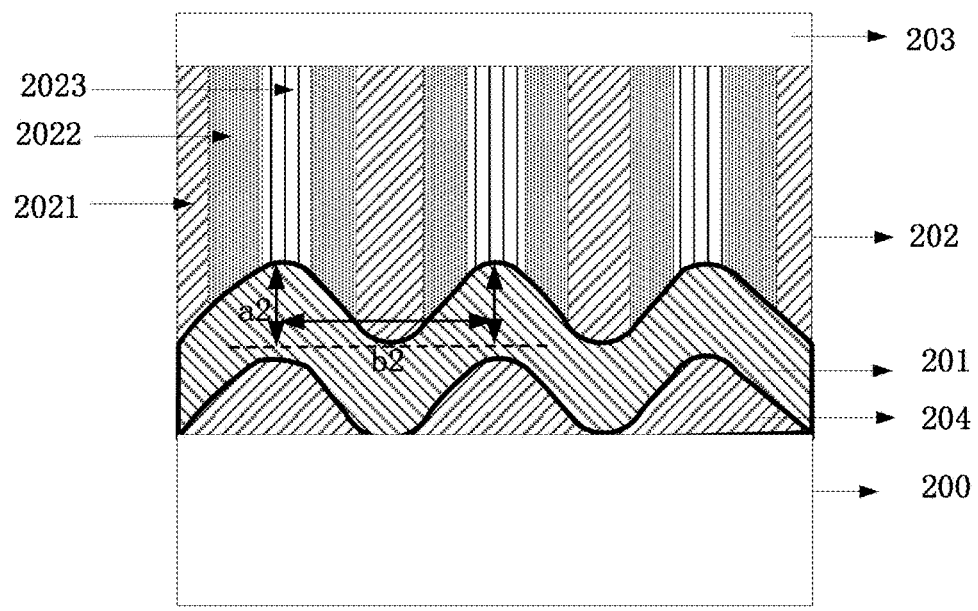
FIG. 7 is a schematic view showing a principle of light-emitting enhancement of the top-emitting white OLED device in FIG. 4.

FIG. 7 is schematic view showing a principle of light-emission enhancement of the top-emitting white OLED device in FIG. 4. As shown in FIG. 7, a thickness of the organic layer 202 is varied at different positions of the pixel unit. A wavelength of red visible light is in a range from 630 to 780 nanometers, and a wavelength of blue visible light is in a range from 420 to 470 nanometers, so an organic layer part 2021 corresponding to the red visible light has a longest cavity length, and an organic layer part 2023 corresponding to the blue visible light has a shortest cavity length. As shown in FIG. 7, an organic layer part 2022 corresponds to visible light of other colors.

Alternatively, a height difference a2 between a crest and a trough of the bump 2011 is within a range of a difference of optic cavity lengths corresponding to a variation of a wavelength of visible light, and an interval b2 (i.e., a period of the crests) between crests (or troughs) of the bumps is smaller than or equal to a width of the pixel unit.

In order to enhance the white light intensity effectively, Alternatively the height difference between a crest and a trough of the bump 2011 is in a range from 20 to 150 nanometers, and the interval between the crests (or troughs) of the bumps 2011 is in a range from 1 to 10 micrometers.

In the embodiment of the present disclosure, the organic layer 202 may include multiple layers. For example, the organic layer 202 may include a hole-injection layer (HIL), a hole-transporting layer, a light-emitting layer, a charge-generating layer, a connecting layer, an electron-transporting layer, an electron-injection layer, a hole-blocking layer, an electron-blocking layer, etc. At least one layer (e.g., the HIL) of the organic layer 202 has a large thickness adjustment tolerance, so as to substantially fill up the fluctuated surface of the first electrode layer, so that the organic layer in the pixel unit may have a gradually-varied cavity length.

In the embodiment of the present disclosure, due to the process, it may be difficult to completely fill up the fluctuated surface of the first electrode layer with the organic layer 202, and the fluctuated surface of the first electrode layer may be filled up with the organic layer 202 partially. Therefore, the second electrode layer 203 on the organic layer 202 has an approximate horizontal state.

Alternatively, the bumps 2011 in the embodiment of the present disclosure are hemispherical or near-hemispherical. Alternatively, the bumps 2011 in the embodiment of the present disclosure may be of other shapes.

Third Embodiment

Figure 8:
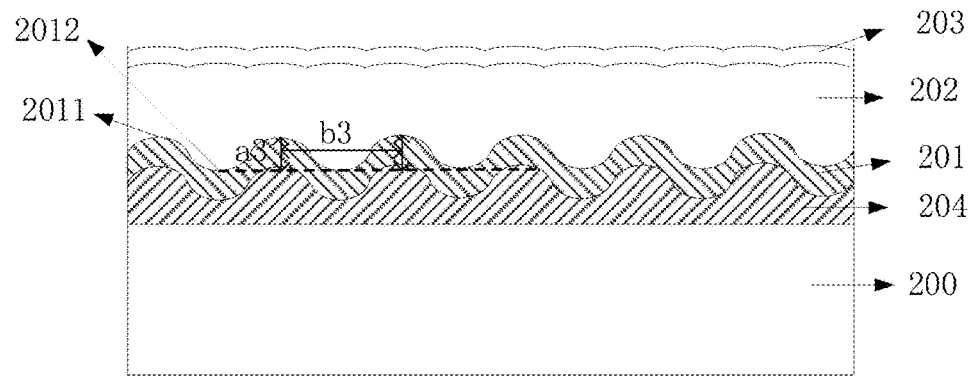
FIG. 8 is a schematic view showing a structure of a top-emitting white OLED device according to yet another embodiment of the disclosure.

FIG. 8 is a schematic view showing a structure of a top-emitting white OLED device according to this embodiment. The difference between the second embodiment and the third embodiment lies in that the lattice structure in the third embodiment includes a plurality of bumps 2011 and pits 2012 arranged at intervals, and a profile of the lattice structure is of a near-sine wave structure.

Alternatively, a height difference a3 between a crest and a trough of the bump 2011 is within a range of a difference of optic cavity lengths corresponding to a variation of a wavelength of visible light, and an interval b3 (i.e., a period of the crests) between crests (or troughs) of the bumps is smaller than or equal to a width of the pixel unit.

In order to enhance the white light intensity effectively, Alternatively the height difference between a crest and a trough of the bump 2011 is in a range from 20 to 150 nanometers, and the interval between the crests (or troughs) of the bumps 2011 is in a range from 1 to 10 micrometers.

Fourth Embodiment

Figure 9:
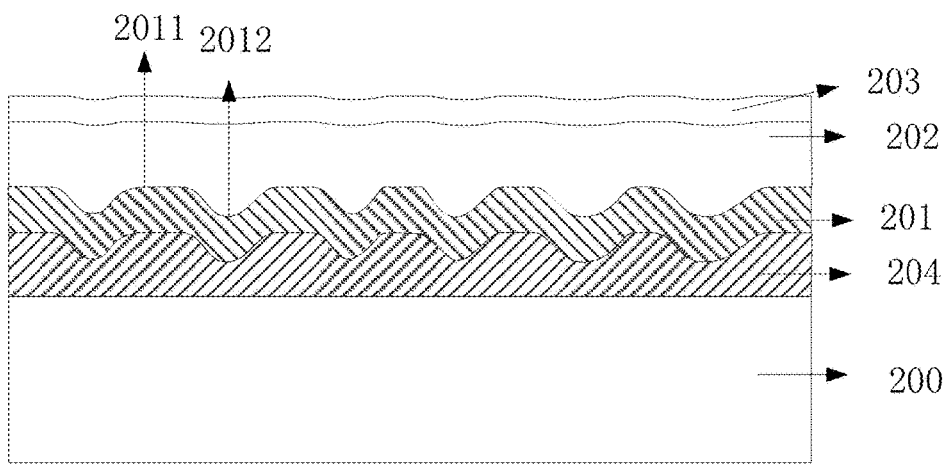
FIG. 9 is a schematic view showing a structure of a top-emitting white OLED device according to still another embodiment of the disclosure.

Alternatively, the bumps 2011 in the embodiment of the present disclosure are hemispherical or near-hemispherical, and the pits 2012 in the embodiment of the present disclosure are hemispherical or near-hemispherical. Alternatively, the bumps 2011 and the pits 2012 may be of other shapes. FIG. 9 is a schematic view showing a structure of a top-emitting white OLED device according to the fourth embodiment of the disclosure.

In the embodiment of the present disclosure, by changing the shape of the first electrode layer (i.e., a bottom electrode) of the top-emitting white OLED device, a thickness of the organic layer is varied at different positions of the pixel unit. Alternatively, the shape of the bottom electrode may not be changed, and the shape of the second electrode layer (i.e., a top electrode) may be changed, i.e., a periodically fluctuated structure (e.g., a lattice structure) is arranged on a surface of the second electrode layer facing the organic layer, such that the cavity length of the organic layer is varied at different positions of the pixel unit. Alternatively, a thickness of the organic layer itself may be changed, such that the cavity length of the organic layer is varied at different positions of the pixel unit.

The OLED device in the embodiment of the present disclosure has the following advantages:

(1) a light-emitting effect of the top-emitting white OLED device may be improved effectively, and a light intensity may not be decreased obviously and an obvious color cast may not occur when a viewing angle is large.

(2) the process in the present disclosure is simple, which may make good use of a microcavity effect of metal, so as to improve an external quantum efficiency of the device and reduce a dependency of a display effect of the device on the viewing angle, and especially suitable for a big-size OLED display screen.

A method for manufacturing an OLED device is further provided in the present disclosure, including a step of forming a plurality of pixel units on a substrate, where each pixel unit includes a first electrode layer, an organic layer and a second electrode layer arranged subsequently on the substrate from bottom up, where the organic layer in each pixel unit includes a gradually-varied cavity length, and the gradually-varied cavity length corresponds to a range from a wavelength of red light to a wavelength of blue light, such that an intensity of white light of the pixel unit is enhanced.

Alternatively, the method for manufacturing an OLED device includes:

Step S11: forming a resin layer on the substrate, where a surface of the resin layer is of a lattice structure, where the lattice structure includes a plurality of continuous bumps, or a plurality of bumps and pits arranged at intervals;

Step S12: forming a first electrode layer on the resin layer, where a surface of the first electrode layer has a same lattice structure as the resin layer;

Step S13: forming an organic layer on the first electrode layer, with which the fluctuated structure of the first electrode layer is substantially filled up; and Step S14: forming a second electrode layer on the organic layer.

The substrate may include a base substrate, a TFT functional layer and a planarizing layer.

The resin layer may be formed by the followings two methods.

Method 1, which includes:

coating a precursor ink configured to form a resin onto the substrate by means of printing, to form a uniform liquid drop lattice structure, removing a solvent from the liquid drop lattice structure, subjecting the liquid drop lattice structure to a cross-linked polymerization, so as to form the resin layer with the lattice structure after the liquid drop lattice structure is cured.

Method 2, which includes:

forming a resin film on the substrate by means of coating; and exposing and developing the resin film by using a photomask, to form the resin layer with a lattice structure.

The method for manufacturing an OLED device according to the embodiment of the present disclosure may include (FIG. 4 shows a structure of the OLED device manufactured by this method):

(1) coating a precursor ink configured to form a resin onto the substrate by means of printing, to form a uniform liquid drop lattice structure, removing a solvent from the liquid drop lattice structure and subjecting the liquid drop lattice structure to a cross-linked polymerization, so as to form the resin layer with a layer of lattice structure after the liquid drop lattice structure is cured, wherein each of the cured resin bump is hemispherical or near-hemispherical, a height difference between a crest and a trough of the bump is in a range from 20 to 150 nanometers, and an interval between the crests or troughs of the bumps is in a range from 1 to 10 micrometers;

(2) depositing a first electrode layer (i.e., a bottom electrode) on the resin layer, and maintaining a fluctuated structure of the resin layer;

(3) depositing an organic layer on the first electrode layer, wherein at least one layer (e.g., a hole-injection layer) of the organic layer has a large thickness adjustment tolerance, which may cause the fluctuated structure of the first electrode layer to be substantially filled up, such that a thickness of the organic layer between the two electrode layers may be varied with the fluctuated of the bottom electrode. The method of forming the organic layer includes wet coating (e.g., spin coating and printing), dry distillation or a combination thereof, where the wet coating is preferable, which may cause the pits to be filled up better; and (4) depositing a second electrode layer on the organic layer (i.e., a top electrode) and packaging the OLED device.

Another method for manufacturing an OLED device according to the embodiment of the present disclosure includes (FIG. 6 shows a structure of the OLED device manufactured by this method):

(1) forming a resin layer on a planarizing layer by means of coating, exposing and developing the resin layer by using a photomask, and using the exposing process to form a lattice structure with hemispherical bumps and bowl-like pits arranged at intervals, wherein a height difference between a crest and a trough of the bump is in a range of 20 to 150 nanometers, and a periodical interval is in a range from 1 to 10 micrometers;

(2) depositing a first electrode layer (i.e., a bottom electrode) on the resin layer, and maintaining a fluctuated structure of the resin layer;

(3) depositing an organic layer on the first electrode layer, wherein at least one layer (e.g., a hole-injection layer) of the organic layer has a large thickness adjustment tolerance, which may cause the fluctuated structure of the first electrode layer to be filled up, such that a thickness of the organic layer between the two electrode layers may be varied with the fluctuated of the bottom electrode. The method of forming the organic layer includes wet coating (e.g., spin coating and printing), dry distillation or a combination thereof, where the wet coating is preferable, which may cause the pits to be filled up better; and (4) depositing a second electrode layer on the organic layer (i.e., a top electrode) and packaging the OLED device.

A display apparatus is further provided by the present disclosure, including the top-emitting white OLED device hereinabove. The display apparatus may be any product or component with display function, such as OLED panels, cell phones, tablet PCs, televisions, displayers, laptops, digital photo frames and navigators.

The above are the preferable embodiments of the present disclosure. It should be noted that, those skilled in the art may make several improvements and modifications without departing from the principle of the present disclosure, and these improvements and modifications may also fall into the scope of the present disclosure.

What is claimed is:

1. A top-emitting white organic light emitting diode (OLED) device, comprising a plurality of pixel units on a substrate, wherein
    each pixel unit comprises a first electrode layer, an organic layer and a second electrode layer arranged subsequently on the substrate from bottom up,
    the organic layer in each pixel unit has a flat upper surface, a continuously-varied thickness and a gradually-varied cavity length, and the gradually-varied cavity length corresponds to a range from a wavelength of red light to a wavelength of blue light, and
    wherein a surface of the first electrode layer facing the organic layer has a periodically fluctuated structure, the periodically fluctuated structure being a lattice structure, which comprises a plurality of continuous bumps, or a plurality of bumps and pits arranged at intervals in two different directions, front to back and side to side, the bumps being hemispherical or near-hemispherical, and the pits being hemispherical.

2. The top-emitting white OLED device according to claim 1, wherein
    a height difference between a crest and a trough of the bump is within a range of a difference of optic cavity lengths corresponding to a variation of a wavelength of visible light, and
    an interval between crests or troughs of the bumps is smaller than or equal to a width of the pixel unit.

3. The top-emitting white OLED device according to claim 2, wherein
    the height difference between the crest and the trough of the bump is in a range from 20 to 150 nanometers, and
    the interval between the crests or troughs of the bumps is in a range from 1 to 10 micrometers.

4. The top-emitting white OLED device according to claim 1, wherein a profile of the lattice structure is a near-sine wave when the lattice structure comprises a plurality of bumps and pits arranged at intervals.

5. The top-emitting white OLED device according to claim 1, further comprising a resin layer under the first electrode layer,
    wherein a surface of the resin layer facing the first electrode layer has a same periodically fluctuated structure as the first electrode layer.

6. The top-emitting white OLED device according to claim 5, wherein the resin layer comprises polyimide.

7. The top-emitting white OLED device according to claim 1, wherein the periodically fluctuated structure of the first electrode layer is substantially filled up with the organic layer.

8. The top-emitting white OLED device according to claim 1, wherein the first electrode layer is a reflective electrode, and the second electrode layer is a transflective electrode.

9. A display apparatus, comprising the top-emitting white OLED device according to claim 1.

10. A method for manufacturing a top-emitting white OLED device, comprising a step of:
    forming a plurality of pixel units on a substrate, wherein
        each pixel unit comprises a first electrode layer, an organic layer and a second electrode layer arranged subsequently on the substrate from bottom up, and
        the organic layer in each pixel unit has a flat upper surface, a continuously-varied thickness and a gradually-varied cavity length, and the gradually-varied cavity length corresponds to a range from a wavelength of red light to a wavelength of blue light;
    the method further comprising:
        forming a resin layer on the substrate, wherein a surface of the resin layer is of a lattice structure comprising a plurality of continuous bumps or a plurality of bumps and pits arranged at intervals in two different directions, front to back and side to side;
        forming a first electrode layer on the resin layer, a surface of the first electrode layer having a same lattice structure as the resin layer;
        forming an organic layer on the first electrode layer, with which a fluctuated structure of the first electrode layer is substantially filled up; and
        forming a second electrode layer on the organic layer,
        wherein the bumps are hemispherical in the lattice structure of the resin layer.

11. The method according to claim 10, wherein
    a height difference between a crest and a trough of the bump is in a range from 20 to 150 nanometers, and
    an interval between the crests or troughs of the bumps is in a range from 1 to 10 micrometers.

12. The method according to claim 10, wherein the step of forming the resin layer on the substrate comprises:
    coating a precursor ink configured to form a resin onto the substrate by means of printing, to form a uniform liquid drop lattice structure,
    removing a solvent from the liquid drop lattice structure, and
    subjecting the liquid drop lattice structure to a cross-linked polymerization, so as to form the resin layer with the lattice structure after the liquid drop lattice structure is cured.

13. The method according to claim 10, wherein the step of forming the resin layer on the substrate comprises:
    forming a resin film on the substrate by means of coating; and
    exposing and developing the resin film by using a photomask, to form the resin layer with a lattice structure.

* * * * *